United States Patent [19]

Anzai et al.

[11] Patent Number: 4,765,925

[45] Date of Patent: Aug. 23, 1988

[54] SOLID STATE LASER HOSTS

[75] Inventors: Yutaka Anzai, Ageo; Kiyoshi Yamagishi, Urawa; Yasuhide Yamaguchi; Kazuo Moriya, both of Ageo, all of Japan

[73] Assignee: Mitsui Mining & Smelting Co. Ltd., Tokyo, Japan

[21] Appl. No.: 26,213

[22] Filed: Mar. 16, 1987

[30] Foreign Application Priority Data

Mar. 17, 1986 [JP] Japan .................................. 61-57115

[51] Int. Cl.$^4$ ...................... C30B 29/00; C09K 11/08; C04B 35/44; C04B 35/08
[52] U.S. Cl. ................. 252/301.4 F; 501/86
[58] Field of Search ................... 501/86; 252/301.4 F

[56] References Cited

U.S. PATENT DOCUMENTS 4,621,065 11/1986 Isogami et al. ...................... 501/86
4,634,492 1/1987 Ogari ................................... 501/86

Primary Examiner—Mark L. Bell
Attorney, Agent, or Firm—Edmund M. Jaskiewicz

[57] ABSTRACT

A chrysoberyl solid laser host which comprises a chrysoberyl matrix doped with trivalent titanium ions for luminescence is described. This host ensures a lasing operation over a wide wavelength range and is highly producible and high in quality.

2 Claims, 5 Drawing Sheets

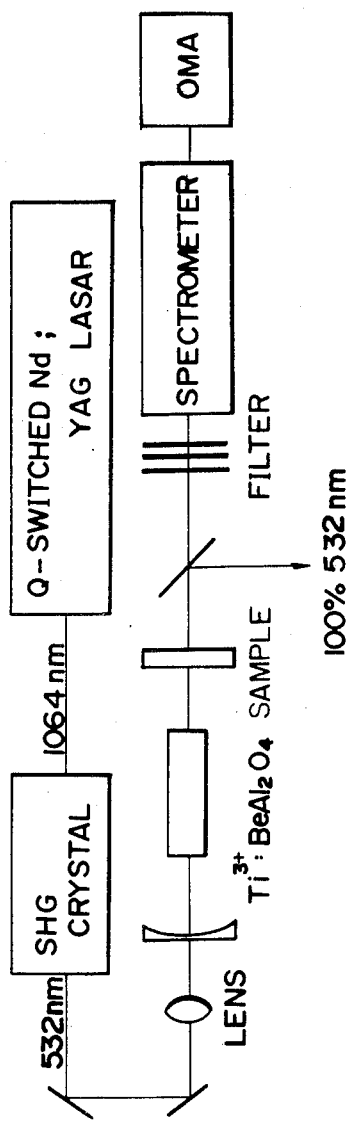
F I G. 3

SOLID STATE LASER HOSTS

BACKGROUND OF THE INVENTION

Field of the Invention

This invention relattes to a solid laser host comprising chrysoberyl (BeAl₂O₄) containing trivalent Ti ions.

Description of the Prior Art

Because of their small size, high output power, easy maintenance and high stability, solid lasers are being increasingly used in various industrial fields.

Among the solid lasers, a conventional oscillation wavelength-fixed type laser, e.g. a solid laser, for example, ruby, or yttrium-aluminium-garnet in which trivalent neodymium has been doped, is limited in its use because it can only oscillate laser beams having a specific wavelength. In recent years, wavelength-variable solid lasers whose oscillation wavelength can be selected in a given range are being studied and are now in practical use. Typical of such wavelength-variable solid lasers having a wavelength tunability are solid lasers using trivalent chromium ions as a luminescent ion, in which the wavelength is variable in the range of from 700 to 824 nm for alexandrite (BeAl$_2$O$_4$:Cr$^{3+}$) and in the range of from 742 to 842 for gadolinium-scandium gallium-garnet (Gd$_3$Sc$_2$Ga$_3$O$_{12}$:Cr$^{3+}$). A known solid laser using trivalent titanium ions as a luminescent ion is titanium-sapphire (Al$_2$O$_3$:Ti$^{3+}$) whose wavelength is variable in the range of from 700 to 900 nm.

However, these wavelength-variable solid lasers are all variable in wavelength in the range of from 700 to 900 nm. Accordingly, there is now a demand of a solid laser which has a wider variable wavelength range.

When titanium-doped sapphire is prepared in an iridium crucible, incorporation of iridium into the crystal of the doped sapphire and deformation of the iridium crucible will be caused because of the high melting point of the doped sapphire, thereby raising problems as to the productivity and quality of the final product.

In general, trivalent titanium ions with which a crystal having a crystal field of 6 coordination sites is doped, will vary in its absorption and fluorescence wavelengths in proportion to the strength of the crystal field. Accordingly, any host crystals having 6 coordination sites may be used in principle and thus, it can be expected to obtain wavelength-variable solid lasers having a variety of central wavelengths. However, because of difficulties in the uniform incorporation of trivalent titanium ions into a crystal, there has never been developed yet any host crystal other than sapphire.

SUMMARY OF THE INVENTION

It is therefore an object of the invention to provide a chrysoberyl solid laser host which enables a laser operation to be performed over a wider wavelength range and which is highly producible and high in quality.

The above object of this invention can be achieved by the provision of a chrysoberyl solid laser host which comprises chrysoberyl doped with trivalent titanium ions serving as a luminescent ion. In other words, the present invention is characterized by incorporating trivalent titanium ions into chrysoberyl. Preferably, the titanium ions are used in an amount of from 0.01 to 1.0 wt % of the host crystal.

BRIEF DESCRIPTION OF THE DRAWINGS

FIG. 3 is a schematic view of an apparatus for evaluating laser oscillations in Example 2;

DETAILED DESCRIPTION OF THE INVENTION

Figure 1:
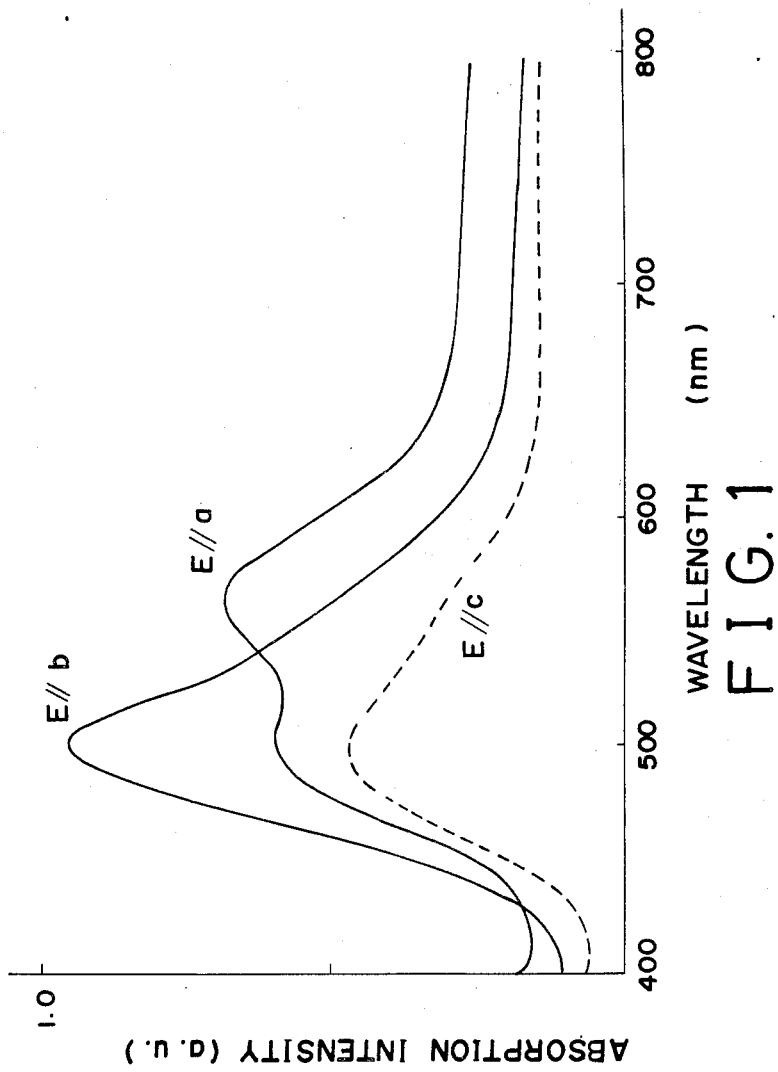
FIG. 1 is a graph showing absorption spectra of polarized light along the directions of the a, b and c axes of a chrysoberyl crystal containing trivalent titanium ions.

The chrysoberyl single crystal containing trivalent titanium ions is prepared by growth using a high frequency heating Czochralski technique or an infrared ray-focussing floating zone technique. The proper selection of the growing conditions enables it to obtain a titanium-containing chrysoberyl crystal which is free from any inclusions and segregated matters.

The starting materials used herein are beryllium oxide (BeO) and aluminium oxide (Al$_2$O$_3$), to which titanium (III) oxide (Ti$_2$O$_3$) is added as a luminescent ion. The trivalent titanium is preferably contained in an amount of from 0.01 to 1.0 wt % of the product crystal. If the content of titanium is less than 0.01 wt %, the efficiency of the product becomes poor and the resultant crystal cannot be used in practice. If titanium is contained in an amount of over 1.0 wt %, segregation of rutile (TiO$_2$) is apt to take place, making it difficult to use the resultant product crystal as a laser.

The product single crystal obtained in this manner was measured for absorption and fluorescence spectra thereby to reveal that a wide absorption range having 500 nm as the center value, indicates the usability of a frequency doubled trivalent neodymium-doped yttrium-aluminium-garnet (YAG: Nd$^{3+}$) laser, an argon ion laser and a copper vapor laser as an ideal excitation source. A short pulse flash lamp may also be used for excitation.

The fluorescence spectrum having a wide range of from 600 nm to 1000 nm ensures a laser oscillation having a wide tunable range. In particular, it can be expected that because the crystal field is smaller than that of sapphire (Al$_2$O$_3$), the variable range can be substantially extended to a range beyond 1 micrometer. As compared with the case where sapphire is used as a matrix crystal, the melting point lowers by 180° C. This is very advantageous from an industrial point of view. More particularly, a crucible made of, for example, iridium or molybdenum and used for melting starting materials to obtain a melt should favorably be used at temperatures as low as possible. Especially, with an iridium crucible, its maximum usable temperature is relatively low (about 2200° C.), so that great care has to be paid for the growth of a sapphire crystal. Chrysoberyl has a melting point lower by about 80° C. than YAG:Nd$^{3+}$ industrially grown by the use of an iridium crucible. Accordingly, incorporation of iridium in the crystal doesn't occur and the iridium crucible doesn't deform, either. Thus, the crucible can be stably re-used more than several times.

The present invention is more particularly described by way of examples.

EXAMPLE 1

Chrysoberyl containing trivalent titanium ions was prepared in the following manner.

For the preparation of a single crystal, an infrared ray focussing single crystal growing furnace was used. Starting materials used were weighed and well mixed in a ratio of 19.70 wt % of beryllium oxide powder, 80.20 wt % of aluminium oxide powder and 0.1 wt % of titanium oxide powder, followed by shaping into the form of a rod by the use of a hydrostatic press and then sintering to obtain a starting rod. The crystal growth rate was in the range of from 0.3 to 3.0 mm/hour. It will be noted that if the crystal growth rate is over 3 mm/hour, air bubbles are undesirably taken in. Seed crystals and the starting rod were rotated in opposite dirrections each at a rate of 20 to 50 r.p.m. An atmosphere may be used either of $H_2$, $H_2$-$CO_2$, $N_2$ or Ar in order not to make an oxidative atmosphere. In this example, a mixed atmosphere of $H_2$ and $CO_2$ was used.

The thus grown crystal was cut into a cubic sample having a dimension of 3×3×3 mm and subjected to optical polishing on six faces thereof. The sample was observed with respect to its absorption spectrum and fluorescence spectrum obtained by excitation with a blue-green Ar ion laser. The results are shown in FIGS. 1 and 2.

FIG. 1 is an absorption spectrum of the chrysoberyl crystal containing trivalent titanium ions in an electric field (E) oscillating along the three crystal axes (axes a to c). In the graph, the ordinate axis indicates an absorption intensity (arbitrary unit) and the abscissa axis indicates a wavelength (nm). From the figure, it will be found that there is a wide range of absorption band around 500 nm.

Figure 2:
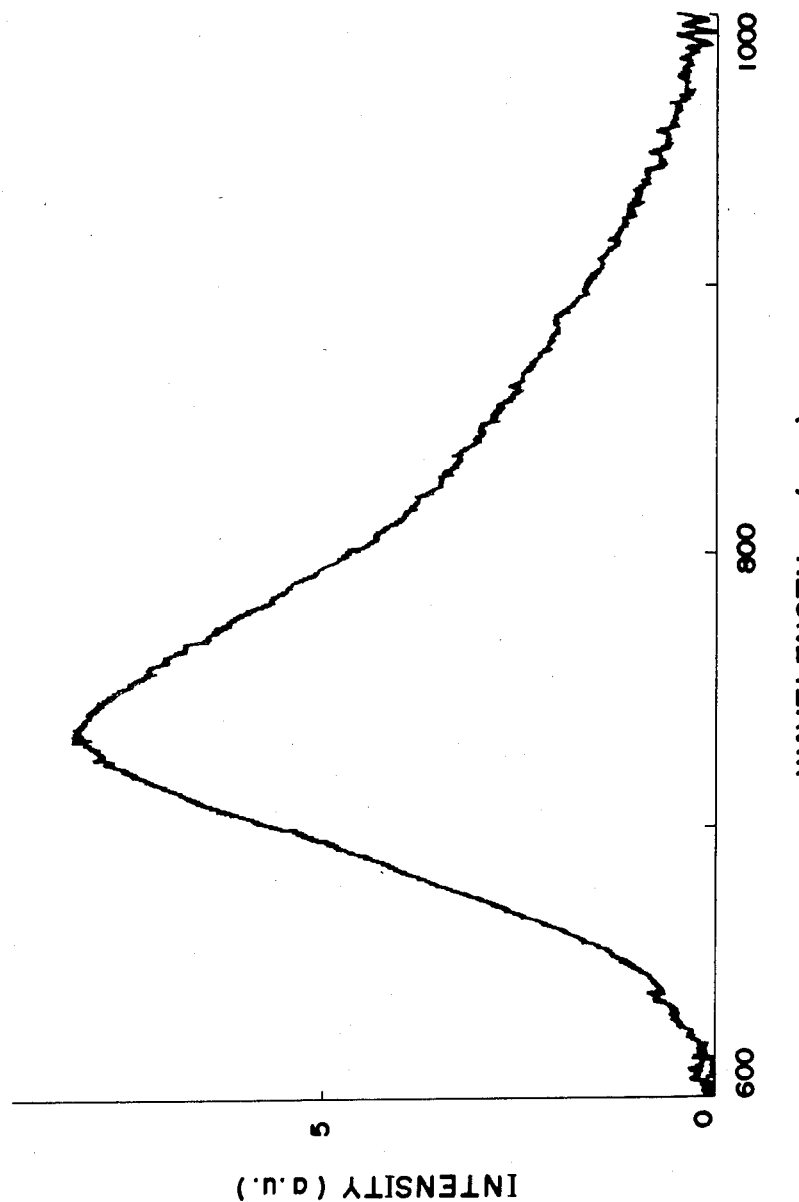
FIG. 2 is a graph showing a fluorescence spectrum of a trivalent titanium ion-containing chrysoberyl crystal excited with a blue and green Ar ion laser.

FIG. 2 is a fluorescence spectrum of the trivalent titanium ion-containing chrysoberyl crystal, in which the ordinate axis indicates a relative fluorescence intensity (arbitrary unit) and the abscissa axis indicates a wavelength (nm). FIG. 2 reveals that fluorescence occurs in a wavelength range of from 600 nm to 1000 nm.

EXAMPLE 2

A large [001] oriented crystal of chrysoberyl cantaining approximately 0.2 atomic percent $Ti^{3+}$ was prepared by being grown by the Czochralski technique with RF (Radio Frequency) heating apparatus. Starting materials used were purified metal oxides (BeO, $Al_2O_3$, $Ti_2O_3$) of at least 99.99% assay.

The Czochralski growth was performed under a flowing inert atmosphere (pure $N_2$ in this case). The pulling rate was selected between 0.3 and 1.0 mm/hour aiming to obtain a crystal highly free from any inclusions.

The grown crystal was about 28 mm in diameter and 180 mm in length. Lasing operation was studied using a sample cut out of the above-mentioned crystal. Its size was 15 mm in diameter and 27 mm in length.

The sample was optically polished and broad band AR (Anti-Reflectin) coated.

Figure 4:
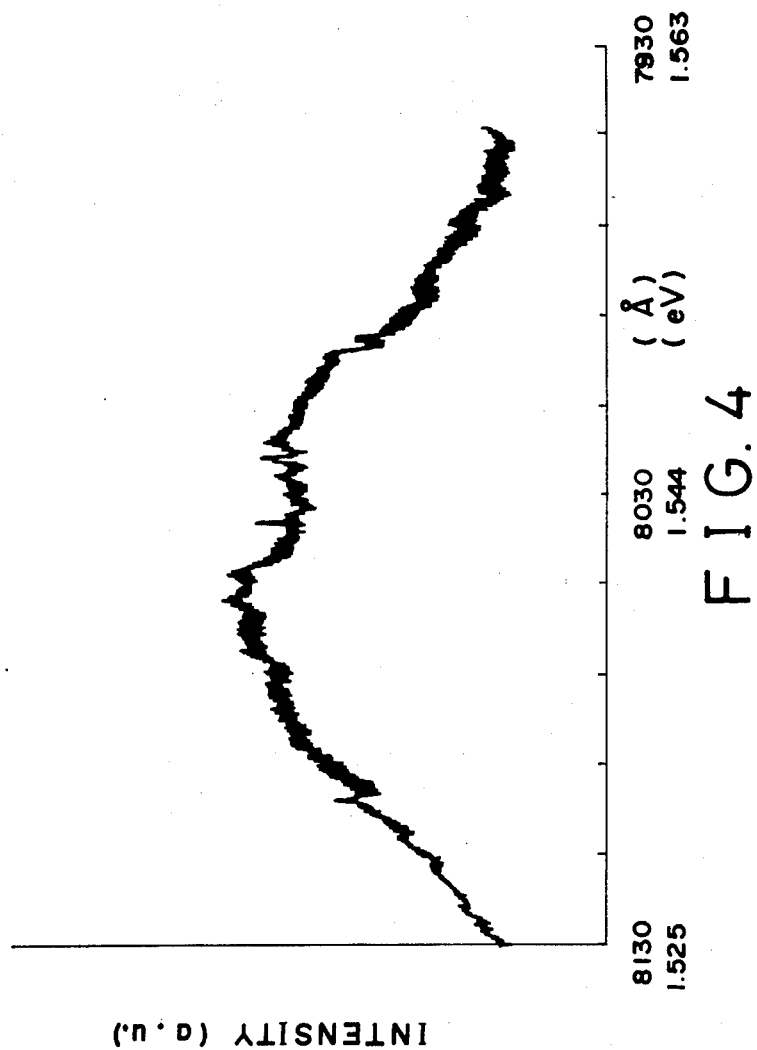
FIG. 4 is a graph showing a laser oscillation spectrum of Example 2 obtained by a multi-channel analyzer.
Figure 5:
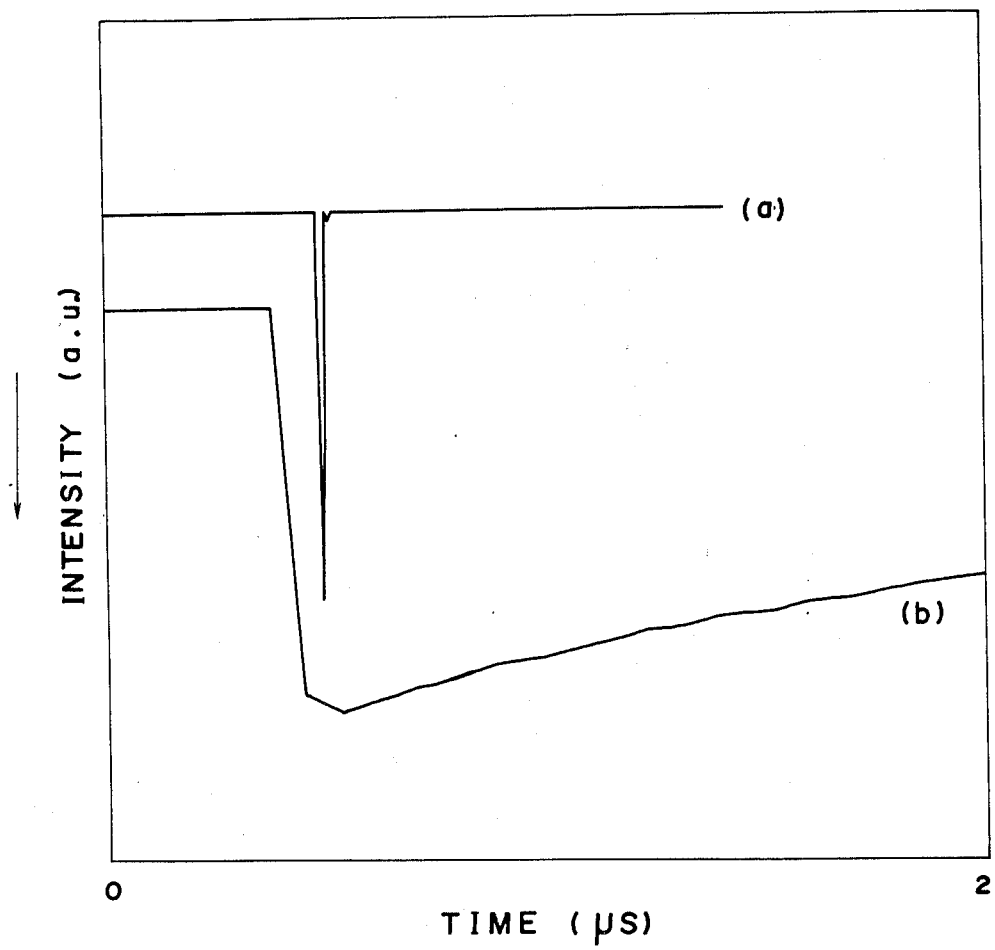
FIG. 5 is a graph showing a fluorescence spectrum (a), in relation to time, obtained by laser oscillation in Example 2 and a fluorescence spectrum (b), in relation to time, obtained by excitation of a laser beam having a pulse width of 10 nanoseconds and a wavelength of 532 nm for comparison.

A schematic view of the experimental setup is shown in FIG. 3. The sample was placed in a cavity about 13 mm long with a 100% reflection at 750 nm, a 40 cm radium of curvature mirror and a 99% reflection flat output coupler. A frequency doubled Q-switched Nd:YAG laser of 10 ns pulse duration was used to pump the crystal longitudinally through the curved mirror. The cavity was set before the focussing point of the YAG laser. A lasing spectrum detected by a multichannel analyzer is shown in FIG. 4. FIG. 5 shows an oscilloscope trace of $Ti^{3+}$:$BeAl_2O_4$ laser pulse. The $Ti^{3+}$:$BeAl_2O_4$ laser has a broad spectrum around 803 nm and less than 80 ns pulse duration.

As will be apparent from the above, the chrysoberyl solid laser host containing trivalent titanium ions according to the invention has fluorescence spectra over a wide range of from 600 nm to 1000 nm and ensures laser oscillations having a wide tuning range. Further, since the laser host of this invention has a somewhat smaller crystal field than sapphire, it can be expected that the laser host extends its substantial variable range beyond one micrometer and that the laser host is used for semiconductor processings because the extended range corresponds to absorption in the vicinity of a band gap of Si, GaAs or the like. In addition, since the laser host of this invention has a low melting point as compared with that in which sapphire is used as the matrix crystal and the starting materials for the former are therefore easily fusible, incorporation of iridium into the product crystal and deformation of a crucible do not take place in the preparation of the present laser host in the crucible. The crucible may thus be stably reused many times. Accordingly, the present laser host will not raise any problems as to its producibility and quality.

What is claimed is:

1. A chrysoberyl solid laser host consisting of a chrysoberyl matrix which is doped with a trivalent titanium ions serving as a luminescent ion thereby to enable a laser operation to be performed over a wider wavelength range.

2. A chrysoberyl solid laser host according to claim 1, wherein said trivalent titanium ions are in an amount of from 0.01 to 1.0 wt % of the host.

* * * * *